United States Patent [19]

Sakamoto

[11] 4,209,751
[45] Jun. 24, 1980

[54] CHANNEL SELECTION APPARATUS

[75] Inventor: Yoichi Sakamoto, Takatsuki, Japan

[73] Assignee: Matsushita Electric Industrial Co., Ltd., Osaka, Japan

[21] Appl. No.: 742,226

[22] Filed: Nov. 16, 1976

[30] Foreign Application Priority Data

Dec. 1, 1975 [JP] Japan .................. 50-143638

[51] Int. Cl.$^2$ .......................................... H04B 1/06
[52] U.S. Cl. ..................................... 455/186; 364/200
[58] Field of Search ................ 325/42, 464, 65, 452, 325/457, 458, 459, 467, 468, 469, 470; 179/15 BC, 15.55 R; 235/312; 360/32, 33; 358/260, 280, 191; 364/200; 334/14

[56] References Cited

U.S. PATENT DOCUMENTS

| | | | |
|---|---|---|---|
| 3,593,801 | 4/1976 | Podowski | 325/464 |
| 3,792,355 | 2/1974 | Miyata et al. | 179/15 BC |
| 3,810,019 | 5/1974 | Miller | 325/40 |
| 3,940,702 | 2/1976 | Yoshimura et al. | 325/464 |
| 3,984,626 | 10/1976 | Mounts et al. | 179/15 BC |
| 3,990,027 | 11/1976 | Kawashima | 325/464 |
| 4,001,563 | 1/1977 | Bied-Charreton et al. | 179/15 BC |
| 4,001,564 | 1/1977 | Bied-Charreton et al. | 179/15 BC |
| 4,011,514 | 3/1977 | Wroblewski | 325/464 |
| 4,013,957 | 3/1977 | Tojo | 325/464 |
| 4,080,659 | 3/1978 | Francini | 364/200 |

Primary Examiner—John C. Martin
Assistant Examiner—Tommy P. Chin
Attorney, Agent, or Firm—Stevens, Davis, Miller & Mosher

[57] ABSTRACT

A channel selection apparatus wherein digitized voltages corresponding to frequencies of respective channel or boundary frequencies each between respective adjacent channels are Hadamard transformed and stored, which are subsequently inverse-Hadamard transformed to reproduce the digitized voltages, which are then used for channel selection or channel indication.

7 Claims, 7 Drawing Figures

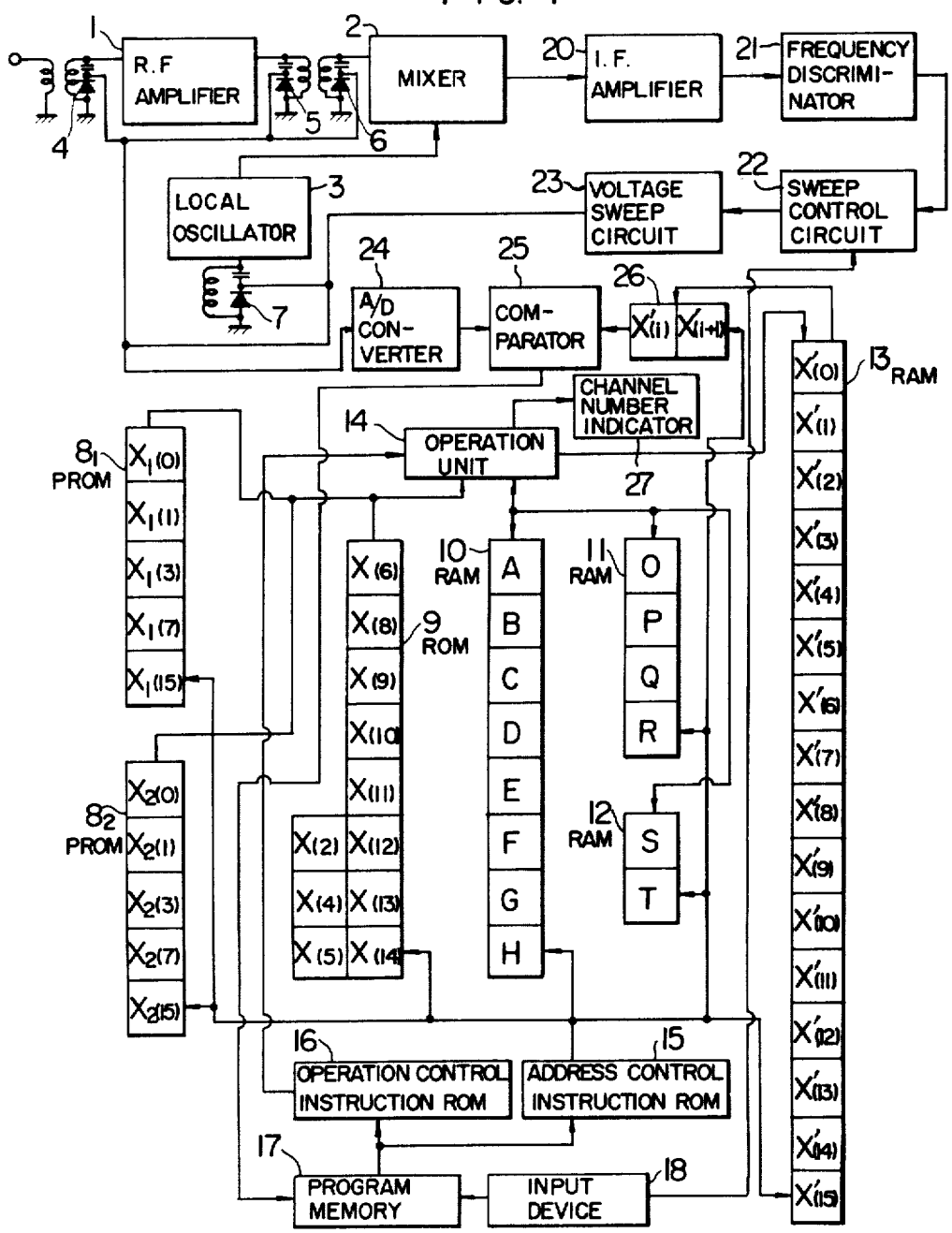

CHANNEL SELECTION APPARATUS

The present invention relates to a channel selection apparatus which can be used in television or radio receivers.

In a channel selection apparatus which uses a variable capacitance diode as a tuning element, a means for producing tuning voltages has been proposed which includes a binary counter circuit and a digital-to-analog converter (D/A converter) driven by an output of the binary counter circuit. Clock pulses are applied to the binary counter circuit to change the content thereof so that when the output voltage of the D/A converter reaches the tuning voltage of a selected broadcasting channel, the generation of the clock pulses is stopped and a channel is accordingly selected. In this system, digital quantities corresponding to the tuning voltages for all channels must be stored in a memory circuit, and hence a large memory capacity is required. Although it is possible to store the digital quantities for only those channels which are actually broadcast in a rewritable memory, this requires the adjustment of the stored digital quantities when a receiver is installed; hence, it is costly because of the extra adjustment step and the need for another service apparatus for effecting the required adjustments.

On the other hand, a so-called searching tuning method has been known, in which a sweep voltage is applied to a variable capacitance diode to cause it to sweep tuning frequencies. When a desired broadcasting wave is detected the sweep is stopped and reception is initiated. With this system no presetting of tuning voltages for each of the channels is necessary and, problems caused by the drifting of a local oscillation frequency is eliminated. However, this system has a disadvantage in that it is difficult to identify a channel number. This poses a problem particularly in a television receivers using a digital indication of the channel numbers. Furthermore, when this system is applied to a radio receiver and a frequency of the received signal is indicated by the needle of a voltmeter in a manner similar to a conventional dial indicator, there exists a drawback in that an error may be produced between an indicated frequency and an actual receiving frequency when a common scale for the voltmeter is used for different radio receivers. This is because the line indicating the relation between an applied voltage of the variable capacitance diode and the receiving frequency is not linear but is curved, and this curve differs for every radio receiver.

The present invention is directed to a system for compressing or reducing the amount of digital information representing tuning voltages or voltages corresponding to boundary frequencies of channels, which are to be stored in a channel selection apparatus for a television or radio receiver which uses a variable capacitance diode (or variable reactance element) as a tuning element.

The preferred embodiments of the present invention will now be described in conjunction with the accompanying drawings, in which;

FIGS. 3, 4, 5, 6 and 7 show block diagrams of other embodiments of the channel selection apparatus of the present invention.

The invention makes particular use of a Hadamard transform to compress the stored data. Information represented by a vector $[x_i]$ consisting of $(x_1, x_2 \ldots x_n)$ may be transformed to a vector $[X_i]$ consisting of $X_1, X_2 \ldots X_n$) by means of a Hadarmard matrix [H]. Because of the inherent nature of the Hadarmard transform, wherein the amplitudes of a small number of components $X_i$ become very large in comparison with those of other $X_i$, and the amplitudes of the other $X_i$ become small, it is possible to reduce the capacity of the entire memory by storing those components $X_i$ which have small amplitudes in a small capacity memory. Also, by using the nature of invariability of energy in the transformation, that is, $$\sum_{i=0}^{N-1} |x_i|^2 = \frac{1}{N} \sum_{i=0}^{N-1} |X_i|^2 \tag{1}$$

where N is a number of order and the above inherent property of the Hadamard transform, i.e., that the amplitudes of the small number of the components $X_i$ become very great in comparison with those of the other components $X_i$, if precise information is stored with respect to the components $X_i$ having large amplitudes and information of average values (e.g. average value of respective tuners) is stored with respect to the components $X_i$ having small amplitudes, and the stored information $[X_i]$ is inverse transformed to $[x'_i]$ by an Hadamard transform, the original information may be reproduced with fairly high precision.

The present invention is one for reducing the time required for a storing operation, by compressing digitized quantities of the tuning voltages for the respective channel and storing them in a field programmable read only memory (PROM), utilizing the above features of the Hadamard transform and also is one for reducing the capacity required of the PROM.

While algorisms of the Hadamard transform and the high speed Hadamard transform are well known, they will be briefly explained for the convenience of explanation.

$$\begin{pmatrix} X_0 \\ X_1 \\ X_2 \\ X_3 \\ X_4 \\ X_5 \\ X_6 \\ X_7 \end{pmatrix} = \begin{pmatrix} 1 & 1 & 1 & 1 & 1 & 1 & 1 & 1 \\ 1 & 1 & 1 & 1 & -1 & -1 & -1 & -1 \\ 1 & 1 & -1 & -1 & -1 & -1 & 1 & 1 \\ 1 & 1 & -1 & -1 & 1 & 1 & -1 & -1 \\ 1 & -1 & -1 & 1 & 1 & -1 & -1 & 1 \\ 1 & -1 & -1 & 1 & -1 & 1 & 1 & -1 \\ 1 & -1 & 1 & -1 & -1 & 1 & -1 & 1 \\ 1 & -1 & 1 & -1 & 1 & -1 & 1 & -1 \end{pmatrix} \begin{pmatrix} x_0 \\ x_1 \\ x_2 \\ x_3 \\ x_4 \\ x_5 \\ x_6 \\ x_7 \end{pmatrix} \begin{matrix} \text{Sequence} \\ 0 \\ 1 \\ 2 \\ 3 \\ 4 \\ 5 \\ 6 \\ 7 \end{matrix}$$

The above equation shows that by transforming a column vector $[x_i]$ by the Hadamard matrix (H matrix) arranged in sequential order, a column vector $[X_i]$ results. While $8^2 = 64$ add/subtract steps are required to perform the above operation, the number of steps can be reduced to 24 by using the high speed Hadamard transform illustrated in FIG. 1.

Figure 1:
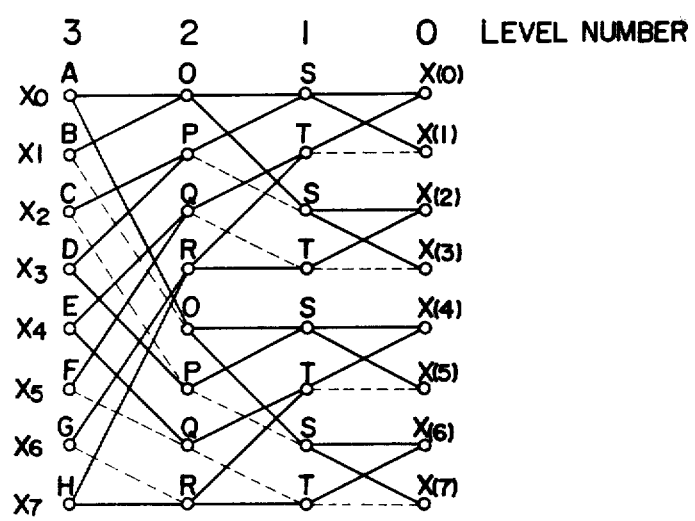
FIG. 1 illustrates a high speed Hadamard transformation used in a channel selection apparatus of the present invention.

Referring to FIG. 1, A, B, C, D, E, F, G, H, O, P, Q, R, S, T, X(0), X(1), X(2), X(3), X(4), X(5), X(6) and X(7) each represents a random access memory (RAM). Digital quantities $x_0, x_1, x_2, x_3, x_4, x_5, x_6$ and $x_7$ are read into the RAMs A, B, C, D, E, F, G and H, respectively. Solid lines indicate that each quantity stored in a RAM of a higher level number is added to a quantity stored in a RAM having a lower level number and the sum is stored in the lower level number RAM. Dotted lines indicate that each quantity stored in a higher level number RAM is added in making the sign of the stored quantity negative to a quantity stored in a lower level number RAM and the sum is stored in the lower level number RAM.

In order to facilitate the understanding of the above operation and to show that the operation of the high speed Hadamard transform is equivalent to that shown in the equation (1) above, Table I is given below. In the Table I, it is assumed that the operation proceeds in a sequence from the top to the bottom of the table.

Table I

| Operation | Memory Content | Result |
|---|---|---|
| $A + B \to O$ | $x_0 + x_1$ | |
| $C + D \to P$ | $x_2 + x_3$ | |
| $E + F \to Q$ | $x_4 + x_5$ | |
| $G + H \to R$ | $x_6 + x_7$ | |
| $O + P \to S$ | $x_0 + x_1 + x_2 + x_3$ | |
| $Q + R \to T$ | $x_4 + x_5 + x_6 + x_7$ | |
| $S + T \to X(0)$ | $x_0 + x_1 + x_2 + x_3 + x_4 + x_5 + x_6 + x_7$ | $X_0$ |
| $S - T \to X(1)$ | $x_0 + x_1 + x_2 + x_3 - x_4 - x_5 - x_6 - x_7$ | $X_1$ |
| $O - P \to S$ | $x_0 + x_1 - x_2 - x_3$ | |
| $R - Q \to T$ | $-x_4 - x_5 + x_6 + x_7$ | |
| $S + T \to X(2)$ | $x_0 + x_1 - x_2 - x_3 - x_4 - x_5 + x_6 + x_7$ | $X_2$ |
| $S - T \to X(3)$ | $x_0 + x_1 - x_2 - x_3 + x_4 + x_5 - x_6 - x_7$ | $X_3$ |
| $A - B \to O$ | $x_0 - x_1$ | |
| $D - C \to P$ | $-x_2 + x_3$ | |
| $E - F \to Q$ | $x_4 - x_5$ | |
| $H - G \to R$ | $-x_6 + x_7$ | |
| $O + P \to S$ | $x_0 - x_1 - x_2 + x_3$ | |
| $Q + R \to T$ | $x_4 - x_5 - x_6 + x_7$ | |
| $S + T \to X(4)$ | $x_0 - x_1 - x_2 + x_3 + x_4 - x_5 - x_6 + x_7$ | $X_4$ |
| $S - T \to X(5)$ | $x_0 - x_1 - x_2 + x_3 - x_4 + x_5 + x_6 - x_7$ | $X_5$ |
| $O - P \to S$ | $x_0 - x_1 + x_2 - x_3$ | |
| $R - Q \to T$ | $-x_4 + x_5 - x_6 + x_7$ | |
| $S + T \to X(6)$ | $x_0 - x_1 + x_2 - x_3 - x_4 + x_5 - x_6 + x_7$ | $X_6$ |
| $S - T \to X(7)$ | $x_0 - x_1 + x_2 - x_3 + x_4 - x_5 + x_6 - x_7$ | $X_7$ |

Figure 2:
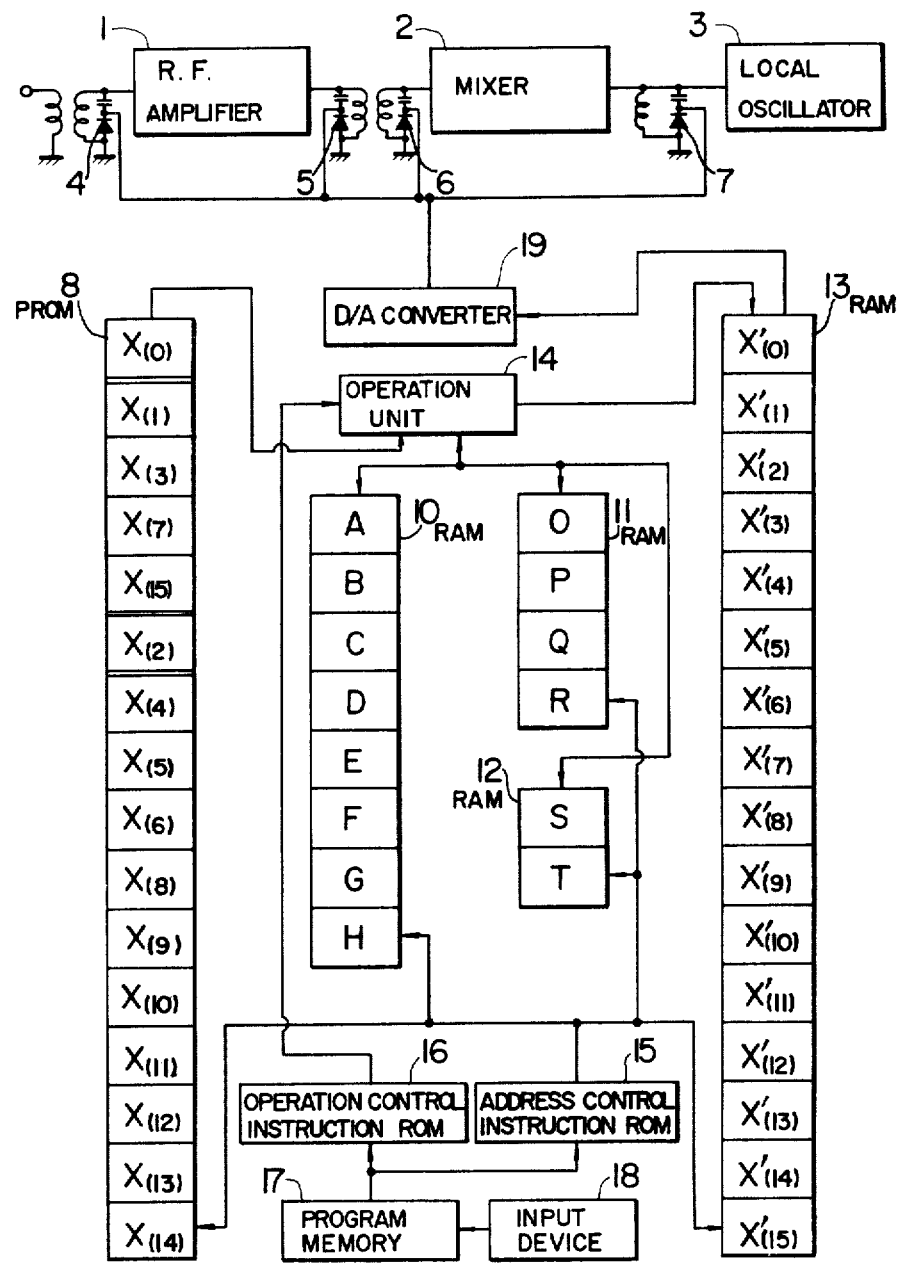
FIG. 2 is a block diagram of one embodiment of the channel selection apparatus of the present invention.

FIG. 2 shows one embodiment of the present invention, in which 1 designates an R-F amplifier, 2 a mixer, 3 a local oscillator, and 4, 5 and 6 variable capacitance diodes which are used as tuning elements. The assembly comprising the components 1 to 7 is hereinafter referred to as an electronic tuner. 8 designates a programmable read only memory (PROM), and 10, 11, 12 and 13 designate random access memories (RAMs). While a RAM and a register may be sometimes called in a general term a read/write memory (RWM), RWM is hereinafter called as the RAM in accordance with usual practice. Although an input register is required to be provided between the PROM 8 and an operation unit 14, it is omitted in the drawing for the sake of simplicity. The term PROM used in this application means a programmable memory, and even if it is a rewritable nonvolatile memory the memories which may function as a ROM during the channel selection operation are inclusively defined as PROM.

Tuning voltages ($x_0$, $x_2$,—$x_{15}$) corresponding to broadcasting channels, examples of particular values of which are shown in Table II, are transformed by using the Hadamard transform described above, and the numbers of bits required at respective addresses are reduced and then stored in the PROM 8 of FIG. 2. The 8-order Hardamard transform described above has been expanded to 16-order transform in FIG. 2.

Table II

| Channel No. | Tuning Voltages $x_i$ (in V) | | | | |
|---|---|---|---|---|---|
| | Tuner 1 | Tuner 2 | Tuner 3 | Tuner 4 | Tuner 5 |
| 14 | 3.645 | 3.780 | 3.610 | 3.648 | 3.682 |
| 15 | 3.975 | 4.128 | 3.911 | 3.973 | 4.007 |
| 16 | 4.298 | 4.494 | 4.219 | 4.362 | 4.343 |
| 17 | 4.611 | 4.872 | 4.533 | 4.652 | 4.691 |
| 18 | 4.927 | 5.255 | 4.848 | 5.014 | 5.043 |
| 19 | 5.253 | 5.635 | 5.162 | 5.380 | 5.391 |
| 20 | 5.587 | 6.011 | 5.473 | 5.733 | 5.736 |
| 21 | 5.919 | 6.383 | 5.779 | 6.082 | 6.082 |
| 22 | 6.247 | 6.753 | 6.080 | 6.432 | 6.430 |
| 23 | 6.570 | 7.121 | 6.378 | 6.783 | 6.779 |
| 24 | 6.893 | 7.487 | 6.675 | 7.135 | 7.128 |
| 25 | 7.216 | 7.851 | 6.970 | 7.486 | 7.476 |
| 26 | 7.538 | 8.213 | 7.265 | 7.836 | 7.824 |
| 27 | 7.862 | 8.572 | 7.559 | 8.186 | 8.172 |
| 28 | 8.182 | 8.928 | 7.852 | 8.533 | 8.518 |
| 29 | 8.503 | 9.282 | 8.146 | 8.878 | 8.864 |

By Hadamard transforming the tuning voltages measured for five electronic tuners, shown in the Table II, the transformed values and means values thereof as shown in Table III ca be obtained. Since the following relations exist, $$[X_i] = [H][x_i] \qquad (2)$$

$$[x_i] = (1/N)\,[H][X_i] \qquad (3)$$

a factor of 1/N should be multiplied in performing the inverse transform. However, when the Hadamard transformed values shown in the Table III are derived, they have already been divided by a factor of N=16 in order to derive the tuning voltages through the inverse transform only by the addition and subtraction operations so as to simplify the operation as much as possible. It should be understood that the transform of $\sqrt{N}/N[H]$ may be used both in the transform operation and the inverse transform operation in order to reduce an error in the inverse transform which may occur due to the reduction in the number of digits or figures. In the illustrated example, the transformed values are divided by a factor of 16, and the least significant digits of the quotients are counted as one into next higher digit positions if they are equal to or more than five and are cut away if they are equal to or less than four, and the resultant values are converted to integers to facilitate the operations. These are shown in Table IV.

Table III

| Sequence | Hadamard Transform $X_i/16$ | | | | | |
|---|---|---|---|---|---|---|
| | Tuner 1 | Tuner 2 | Tuner 3 | Tuner 4 | Tuner 5 | Average |
| 0 | 6.0766 | 6.5478 | 5.9037 | 6.2570 | 6.2603 | 6.2091 |
| 1 | −1.2977 | −1.4780 | −1.2118 | −1.4015 | −1.3884 | −1.3559 |
| 2 | 0.0001 | −0.0141 | −0.0168 | 0.0014 | 0.0022 | −0.0054 |
| 3 | −0.6447 | −0.7370 | −0.6067 | −0.6981 | −0.6933 | −0.6760 |
| 4 | 0.0018 | 0.0004 | −0.0001 | 0.0006 | 0.0018 | 0.0009 |
| 5 | 0.0027 | 0.0053 | 0.0014 | 0.0028 | 0.0030 | 0.0030 |
| 6 | −0.0023 | −0.0045 | −0.0069 | −0.0011 | 0.0032 | −0.0023 |
| 7 | −0.3244 | −0.3656 | −0.3021 | −0.3505 | −0.3443 | −0.3374 |
| 8 | −0.0008 | 0.0008 | 0.0001 | −0.0035 | 0.0011 | −0.0004 |

Table III-continued

| | Hadamard Transform $X_i/16$ | | | | | |
|---|---|---|---|---|---|---|
| Sequence | Tuner 1 | Tuner 2 | Tuner 3 | Tuner 4 | Tuner 5 | Average |
| 9 | −0.0004 | 0.0019 | 0.0004 | −0.0029 | 0.0015 | 0.0001 |
| 10 | −0.0016 | 0.0023 | 0.0015 | −0.0014 | 0.0014 | 0.0004 |
| 11 | −0.0012 | 0.0024 | 0.0011 | −0.0008 | 0.0016 | 0.0006 |
| 12 | 0.0008 | 0.0004 | 0.0000 | 0.0058 | 0.0011 | 0.0016 |
| 13 | 0.0010 | 0.0028 | 0.0006 | 0.0066 | 0.0015 | 0.0025 |
| 14 | −0.0006 | −0.0020 | −0.0033 | 0.0041 | 0.0014 | −0.0000 |
| 15 | −0.1619 | −0.1826 | −0.1510 | −0.1704 | −0.1723 | −0.1676 |

Table IV

| | Values to be stored $X_i$ | | | | | Number of |
|---|---|---|---|---|---|---|
| Sequence | Tuner 1 | Tuner 2 | Tuner 3 | Tuner 4 | Tuner 5 | bits required |
| 0 | 6077 | 6548 | 5904 | 6257 | 6260 | 16 |
| 1 | −1300 | −1478 | −1212 | −1402 | −1388 | 12 |
| 2 | 0 | −14 | −17 | 1 | 2 | 8 |
| 3 | −645 | −737 | −607 | −698 | −693 | 12 |
| 4 | 2 | 0 | 0 | 1 | 2 | 4 |
| 5 | 3 | 5 | 1 | 3 | 3 | 4 |
| 6 | −2 | −5 | −7 | −1 | 3 | 4 |
| 7 | −324 | −366 | −302 | −351 | −344 | 12 |
| 8 | −1 | 1 | 0 | −4 | 1 | 4 |
| 9 | 0 | 2 | 0 | −3 | 2 | 4 |
| 10 | −2 | 2 | 2 | −1 | 1 | 4 |
| 11 | −1 | 2 | 1 | −1 | 2 | 4 |
| 12 | 1 | 0 | 0 | 6 | 1 | 4 |
| 13 | 1 | 3 | 1 | 7 | 2 | 4 |
| 14 | −1 | −2 | −3 | 4 | 1 | 4 |
| 15 | −162 | −183 | −151 | −170 | −172 | 12 |

The operation of FIG. 2 will now be described in detail. The $X_i$ at the sequence 0, i.e. $X_0$ is of 16 bits and is stored at the address $X(0)$ of PROM (8), and $X_1$, $X_3$, $X_7$ and $X_{15}$ are each of 12 bits and are stored at the addresses $X(1)$, $X(3)$, $X(7)$ and $X(15)$, respectively, and $X_2$ is of 8 bits and is stored at the address $X(2)$, and $X_4$, $X_5$, $X_6$, $X_8$, $X_9$, $X_{10}$, $X_{11}$, $X_{12}$, $X_{13}$ and $X_{14}$ are each of 4 bits and are stored at the addresses $X(4)$, $X(5)$, $X(6)$, $X(8)$, $X(9)$, $X(10)$, $X(11)$, $X(12)$, $X(13)$ and $X(14)$, respectively. Numeral 14 designates the operation unit, numeral 15 a ROM which stores address control instructions, numeral 16 a ROM which stores operation control instructions, numeral 17 a program memory which stores programs for controlling the ROM's 15 and 16, and 18 an input device to the program memory 17. By the output of the input device 18 a program in the program memory 17 is selected, and by the output of the memory 17 the ROMs 15 and 16 are controlled to sequentially output the address control instruciton signals from the ROM 15 and the operation instruction signals from the ROM 16. In accordance with the address control instructions from the ROM 15, the information stored in the PROM 8 enters into the operation unit 14 through an input register (not shown), and in the operation unit 14 the operation specified by the output of ROM 16 is performed. Thus, all data manipulation operations shown in Table V are sequentially performed in accordance with the operation instructions from ROM 16 and the address control instructions from the ROM 15. For example, the expression $X(0)+X(1)—A$ in the first operation in Table V-A means that the information stored in PROM 8 at addresses $X(0)$ and $X(1)$ are read into the operation unit 14, where they are added; the resulting sum is stored in the location A of RAM 10. The other expressions in Table V are similarly construed and performed. FIG. 2 shows that address control instructions from the ROM 15 are also applied to RAMs 10, 11 and 12 for transferring information between the operation unit 14 and the RAMs 10, 11 and 12 during the performance of the operational sequences illustrated in Table V.

The results of the operations are stored at the respective addresses of the RAM 13. The $x_0'$, $x_1'$,—$x_{15}'$ stored in the RAM 13 are selected by the address control instructions from the ROM 15, and are applied to the electronic tuner as the tuning voltage through a D/A converter 19.

Table V-A

| Operation Sequence | Operation | Result |
|---|---|---|
| 1 | $X(0) + X(1) \rightarrow A$ | |
| 2 | $X(2) + X(3) \rightarrow B$ | |
| 3 | $X(4) + X(5) \rightarrow C$ | |
| 4 | $X(6) + X(7) \rightarrow D$ | |
| 5 | $X(8) + X(9) \rightarrow E$ | |
| 6 | $X(10) + X(11) \rightarrow F$ | |
| 7 | $X(12) + X(13) \rightarrow G$ | |
| 8 | $X(14) + X(15) \rightarrow H$ | |
| 9 | $A + B \rightarrow O$ | |
| 10 | $C + D \rightarrow P$ | |
| 11 | $E + F \rightarrow Q$ | |
| 12 | $G + H \rightarrow R$ | |
| 13 | $O + P \rightarrow S$ | |
| 14 | $Q + R \rightarrow T$ | |
| 15 | $S + T \rightarrow x'(0)$ | $x'0$ |
| 16 | $S - T \rightarrow x'(1)$ | $x'1$ |
| 17 | $O - P \rightarrow S$ | |
| 18 | $R - Q \rightarrow T$ | |
| 19 | $S + T \rightarrow x'(2)$ | $x'2$ |
| 20 | $S - T \rightarrow x'(3)$ | $x'3$ |
| 21 | $A - B \rightarrow O$ | |
| 22 | $D - C \rightarrow P$ | |
| 23 | $E - F \rightarrow Q$ | |
| 24 | $H - G \rightarrow R$ | |
| 25 | $O + P \rightarrow S$ | |
| 26 | $Q + R \rightarrow T$ | |
| 27 | $S + T \rightarrow x'(4)$ | $x'4$ |
| 28 | $S - T \rightarrow x'(5)$ | $x'5$ |
| 29 | $O - P \rightarrow S$ | |
| 30 | $R - Q \rightarrow T$ | |
| 31 | $S + T \rightarrow x'(6)$ | $x'6$ |
| 32 | $x - T \rightarrow x'(7)$ | $x'7$ |
| 33 | $X(0) - X(1) \rightarrow A$ | |
| 34 | $X(3) - X(2) \rightarrow B$ | |
| 35 | $X(4) - X(5) \rightarrow C$ | |
| 36 | $X(7) - X(6) \rightarrow D$ | |
| 37 | $X(8) - X(9) \rightarrow E$ | |
| 38 | $X(11) - X(10) \rightarrow F$ | |
| 39 | $X(12) - X(13) \rightarrow G$ | |
| 40 | $X(15) - X(14) \rightarrow H$ | |

Table V-B

| Operation Sequence | Operation | Result |
|---|---|---|
| 41 | $A + B \rightarrow O$ | |
| 42 | $C + D \rightarrow P$ | |
| 43 | $E + F \rightarrow Q$ | |
| 44 | $G + H \rightarrow R$ | |
| 45 | $O + P \rightarrow S$ | |
| 46 | $Q + R \rightarrow T$ | |
| 47 | $S + T \rightarrow x'(8)$ | $x'8$ |
| 48 | $S - T \rightarrow x'(9)$ | $x'9$ |

Table V-B-continued

| Operation Sequence | Operation | Result |
|---|---|---|
| 49 | O − P → S | |
| 50 | R − Q → T | |
| 51 | S + T → x'(10) | x'10 |
| 52 | S − T → x'(11) | x'11 |
| 53 | A − B → O | |
| 54 | D − C → P | |
| 55 | E − F → Q | |
| 56 | H − G → R | |
| 57 | O + P → S | |
| 58 | Q + R → T | |
| 59 | S + T → x'(12) | x'12 |
| 60 | S − T → x'(13) | x'13 |
| 61 | O − P → S | |
| 62 | R − Q → T | |
| 63 | S + T → x'(14) | x'14 |
| 64 | S − T → x'(15) | x'15 |

In storing the values shown in Table IV which values have been previously obtained in the PROM 8 of FIG. 2, by carrying out the above operations, the results as shown in Table VI are obtained. Although the maximum absolute value of the error is 5 mV, since the sensitivity of the tuning frequency to a voltage applied to the variable capacitance diode is about 20 kHz/mV in the case of UHF television tuner, the frequency deviation does not cause any problem provided that an automatic frequency control (AFC) is carried out.

If the information shown in the Table II is stored in the PROM without making the Hadamard transformation thereof, the memory capacity of 16×16=256 bits would be required assuming that each word includes 16 bits. However, according to the apparatus shown in FIG. 2, the memory capacity can be reduced to 16+12×4+8+4×10=112 bits, as it is apparent from the Table IV. Here, it is assumed that the memory is partitioned by four bits.

Figure 3:
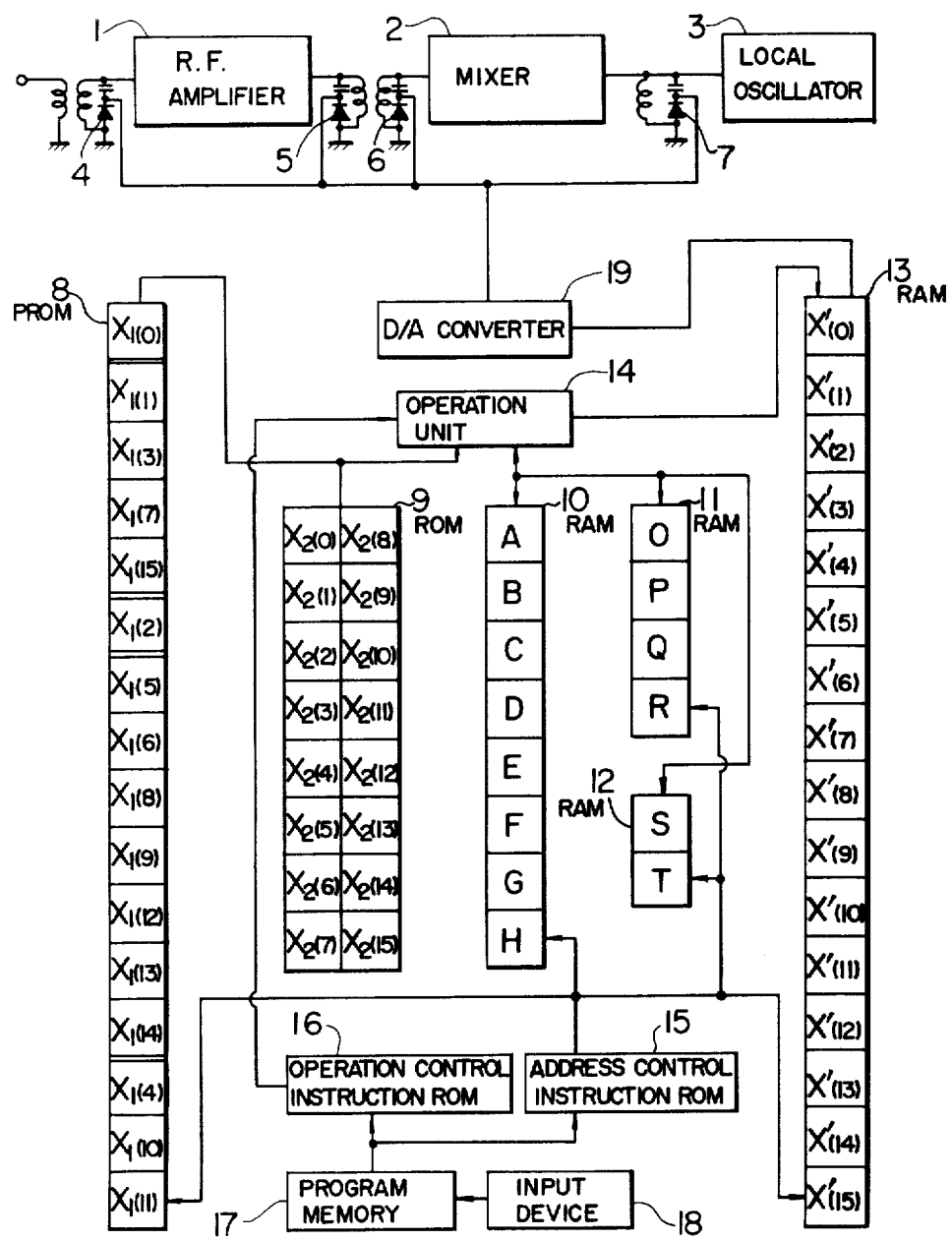

FIG. 3 shows a second embodiment of the present invention in which the information stored in the PROM 8 in FIG. 2 is stored in PROM 8 and ROM 9 which divide the stored information. More particularly, ROM 9 stores average values of the respective sequences while PROM 8 stores differences between the $X_i$ shown in Table IV and the average values. The differences between $X_i$ and the average values obtained by calculating values in Table IV are shown in Table VII. With the apparatus of FIG. 3, the expensive memory capacity of the PROM can be further reduced to 12×2+8×4+4×10=96 bits, as is apparent from the Table VII.

Table VII

| Sequence | Average | Difference Tuner 1 | Tuner 2 | Tuner 3 | Tuner 4 | Tuner 5 | Number of Bits Required |
|---|---|---|---|---|---|---|---|
| 0 | 6209 | −132 | 339 | −305 | 48 | 51 | 12 |
| 1 | −1356 | 56 | −122 | 144 | −46 | −32 | 12 |
| 2 | −5 | 5 | −9 | −12 | −4 | −3 | 8 |
| 3 | −676 | 31 | −61 | 69 | −22 | −17 | 8 |
| 4 | 1 | 1 | −1 | −1 | 0 | 1 | 4 |
| 5 | 3 | 0 | 2 | −2 | 0 | 0 | 4 |
| 6 | −2 | 0 | −3 | −5 | 1 | 5 | 4 |
| 7 | −337 | 13 | −29 | 35 | −14 | −7 | 8 |
| 8 | 0 | −1 | 1 | 0 | −4 | 1 | 4 |
| 9 | 0 | 0 | 2 | 0 | −3 | 2 | 4 |
| 10 | 0 | −2 | 2 | 2 | −1 | 1 | 4 |
| 11 | 1 | −2 | 1 | 0 | −2 | 1 | 4 |
| 12 | 2 | −1 | −2 | −2 | 4 | −1 | 4 |
| 13 | 3 | −2 | 0 | −2 | 4 | −1 | 4 |
| 14 | 0 | −1 | −2 | −3 | 4 | 1 | 4 |
| 15 | −168 | 6 | −15 | 17 | −2 | −4 | 8 |

Figure 4:
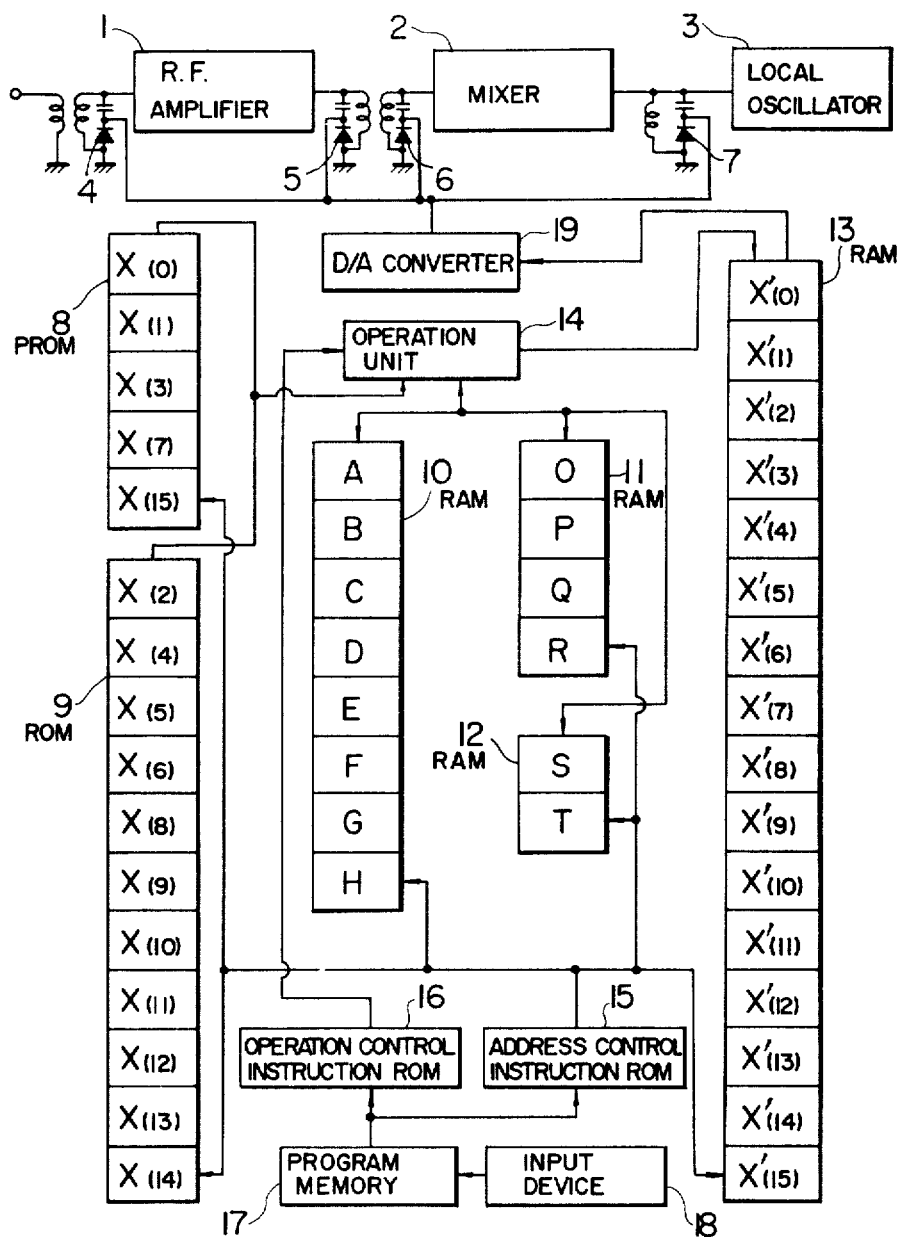

FIG. 4 shows a third embodiment of the present invention. In this embodiment, as shown in Table VIII, of the Hadamard transformed quantities, only those quantities having large values are stored in the PROM 8, and average quantities for the five tuners for those having smaller values are stored in the ROM 9. The

Table VI

| | Tuner 1 | | Tuner 2 | | Tuner 3 | | Tuner 4 | | (in mV) Tuner 5 | |
|---|---|---|---|---|---|---|---|---|---|---|
| Channel No. | Inverse Transform $X'_i$ | Error | Inverse Transform $X'_i$ | Error | Inverse Transform $x'_i$ | Error | Inverse Transform $x'_i$ | Error | Inverse Transform $x'_i$ | Error |
| 14 | 3646 | 1 | 3778 | −2 | 3610 | 0 | 3648 | 0 | 3683 | 1 |
| 15 | 3976 | 1 | 4128 | 0 | 3910 | −1 | 3972 | −1 | 4007 | 0 |
| 16 | 4296 | −2 | 4496 | 2 | 4220 | 1 | 4362 | 0 | 4343 | 0 |
| 17 | 4610 | −1 | 4874 | 2 | 4532 | −1 | 4650 | −2 | 4691 | 0 |
| 18 | 4928 | 1 | 5256 | 1 | 4848 | 0 | 5012 | −2 | 5043 | 0 |
| 19 | 5254 | 1 | 5634 | −1 | 5164 | 2 | 5380 | 0 | 5391 | 0 |
| 20 | 5586 | −1 | 6010 | −1 | 5474 | 1 | 5734 | 1 | 5735 | −1 |
| 21 | 5920 | 1 | 6384 | 1 | 5778 | −1 | 6082 | 0 | 6083 | 1 |
| 22 | 6248 | 1 | 6752 | −1 | 6080 | 0 | 6432 | 0 | 6431 | 1 |
| 23 | 6570 | 0 | 7122 | 1 | 6380 | 2 | 6784 | 1 | 6779 | 0 |
| 24 | 6894 | 1 | 7486 | −1 | 6674 | −1 | 7138 | 3 | 7127 | −1 |
| 25 | 7216 | 0 | 7852 | 1 | 6970 | 0 | 7486 | 0 | 7475 | −1 |
| 26 | 7538 | 0 | 8214 | 1 | 7266 | 1 | 7836 | 0 | 7823 | −1 |
| 27 | 7864 | 2 | 8572 | 0 | 7558 | −1 | 8184 | −2 | 8171 | −1 |
| 28 | 8184 | 2 | 8928 | 0 | 7852 | 0 | 8534 | 1 | 8519 | 1 |
| 29 | 8502 | −1 | 9282 | 0 | 8148 | 2 | 8878 | 0 | 8859 | −5 | other constructions are the same as those shown in FIG. 2 with the same symbols or reference characters, and the operation is the same as the one described in using Table V with respect to FIG. 2.

In the present embodiment, what is stored in the PROM 8 is the Hadamard transformed values for the Hadamard transformations whose sequences are only 0, 1, 3, 7 and 15, and average values for the five tuners are used for the transformed values of other sequences, therefore; the errors are larger than those shown in the Table VI, as it is shown in Table IX. However, as stated above, since the sensitivity of the tuning frequency to the applied voltage is about 20 KHz/mV, the AFC is operable within the limit thereof assuming that the range of AFC pull-ins is ±1.2 MHz and a drift of the local oscillation of the electronic tuner is ±700 KHz. This embodiment can be applied for practical use when the variation of the values shown in Table III is made smaller.

Table VIII

| Sequence | Quantities to be stored $X_i$ | | | | | Number of Bits Required |
|---|---|---|---|---|---|---|
| | Tuner 1 | Tuner 2 | Tuner 3 | Tuner 4 | Tuner 5 | |
| 0 | 6077 | 6548 | 5904 | 6257 | 5260 | 16 |
| 1 | −1300 | −1478 | −1212 | −1402 | −1388 | 12 |
| 2 | −5 | −5 | −5 | −5 | −5 | |
| 3 | −645 | −737 | −607 | −698 | −693 | 12 |
| 4 | 1 | 1 | 1 | 1 | 1 | |
| 5 | 3 | 3 | 3 | 3 | 3 | |
| 6 | −2 | −2 | −2 | −2 | −2 | |
| 7 | −324 | −366 | −302 | −351 | −344 | 12 |
| 8 | 0 | 0 | 0 | 0 | 0 | |
| 9 | 0 | 0 | 0 | 0 | 0 | |
| 10 | 0 | 0 | 0 | 0 | 0 | |
| 11 | 1 | 1 | 1 | 1 | 1 | |
| 12 | 2 | 2 | 2 | 2 | 2 | |
| 13 | 3 | 3 | 3 | 3 | 3 | |
| 14 | 0 | 0 | 0 | 0 | 0 | |
| 15 | −162 | −183 | −151 | −170 | −172 | 8 |

Table IX unit: mV

| Channel No. | Tuner 1 Inverse Transform $x'_i$ | Error | Tuner 2 Inverse Transform $x'_i$ | Error | Tuner 3 Inverse Transform $x'_i$ | Error | Tuner 4 Inverse Transform $x'_i$ | Error | Tuner 5 Inverse Transform $x'_i$ | Error |
|---|---|---|---|---|---|---|---|---|---|---|
| 14 | 3649 | 4 | 3787 | 7 | 3635 | 25 | 3639 | −9 | 3666 | −16 |
| 15 | 3961 | −14 | 4141 | 13 | 3925 | 14 | 3967 | −6 | 3998 | −9 |
| 16 | 4291 | −7 | 4513 | 19 | 4233 | 14 | 4335 | −27 | 4348 | 5 |
| 17 | 4607 | −4 | 4871 | −1 | 4527 | −6 | 4667 | 15 | 4684 | −7 |
| 18 | 4929 | 2 | 5251 | −4 | 4839 | −9 | 5025 | 11 | 5042 | −1 |
| 19 | 5265 | 12 | 5629 | −6 | 5153 | −9 | 5377 | −3 | 5398 | 7 |
| 20 | 5591 | 4 | 5997 | −14 | 5457 | −16 | 5741 | 8 | 5744 | 8 |
| 21 | 5923 | 4 | 6371 | −12 | 5767 | −12 | 6089 | 7 | 6096 | 14 |
| 22 | 6251 | 4 | 6745 | −8 | 6061 | −19 | 6445 | 13 | 6444 | 14 |
| 23 | 6575 | 5 | 7111 | −10 | 6363 | −15 | 6785 | 2 | 6788 | 9 |
| 24 | 6897 | 4 | 7475 | −12 | 6663 | −12 | 7145 | 10 | 7130 | 2 |
| 25 | 7225 | 9 | 7845 | −6 | 6969 | −1 | 7489 | 3 | 7478 | 2 |
| 26 | 7535 | −3 | 8213 | 0 | 7269 | 4 | 7835 | −1 | 7824 | 00 |
| 27 | 7859 | −3 | 8579 | 7 | 7571 | 12 | 8175 | −11 | 8186 | −4 |
| 28 | 8177 | −5 | 8939 | 11 | 7867 | 15 | 8531 | −2 | 8506 | −12 |
| 29 | 8497 | −6 | 9301 | 19 | 8165 | 19 | 8867 | −11 | 8846 | −18 |

With the constitution as shown in FIG. 4, only 16 bits of memory capacity is sufficient for X(0) of the PROM 8, 12 bits for each of X(1), X(3) and X(7), and 8 bits for X(15). Here, the plus and minus signs are inherent to the respective sequences and should be stored in the ROM, although they are not shown in the drawings. Thus, the information to be stored in the PROM can be reduced to 16+12×3+8=60 bits.

Figure 5:
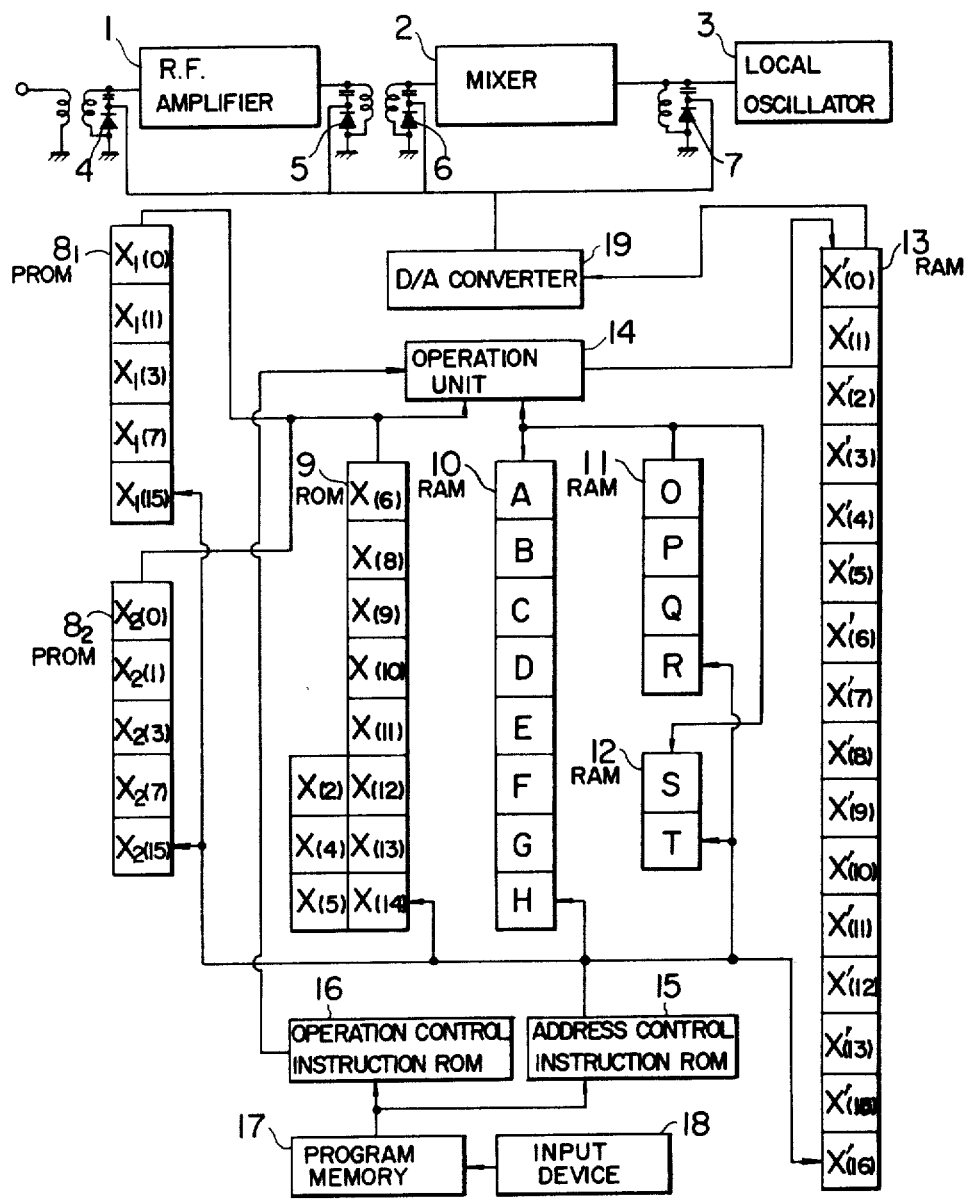

FIG. 5 shows a fourth embodiment of the present invention. In this embodiment, the information stored in the PROM 8 shown in FIG. 4 is stored in PROm $8_1$ and PROM $8_2$ which divide the information. What is stored in the PROM $8_2$ is average values for the sequences 0, 1, 3, 7 and 15 and what is stored in the PROM $8_1$ is the differences between the values at the same sequences shown in Table IV and the average values thereof. An example of particular values is shown in Table X. Thus, the memory capacity of the PROM can be reduced to 12×2+8×3=48 bits.

Table X

| Sequence | Average | Difference | | | | | Number of Bits Required |
|---|---|---|---|---|---|---|---|
| | | Tuner 1 | Tuner 2 | Tuner 3 | Tuner 4 | Tuner 5 | |
| 0 | 6209 | −134 | 339 | −305 | 48 | 51 | 12 |
| 1 | −1356 | 56 | −122 | 144 | −46 | −32 | 12 |
| 2 | | | | | | | |
| 3 | −676 | 31 | −61 | 69 | −22 | −17 | 8 |
| 4 | | | | | | | |
| 5 | | | | | | | |
| 6 | | | | | | | |
| 7 | −337 | 13 | −29 | 35 | −14 | −7 | 8 |
| 8 | | | | | | | |
| 9 | | | | | | | |
| 10 | | | | | | | |
| 11 | | | | | | | |
| 12 | | | | | | | |
| 13 | | | | | | | |
| 14 | | | | | | | |

Table X-continued

| Sequence | Average | Difference | | | | | Number of Bits Required |
|---|---|---|---|---|---|---|---|
| | | Tuner 1 | Tuner 2 | Tuner 3 | Tuner 4 | Tuner 5 | |
| 15 | −168 | 6 | −15 | 17 | −2 | −4 | 8 |

Figure 6:
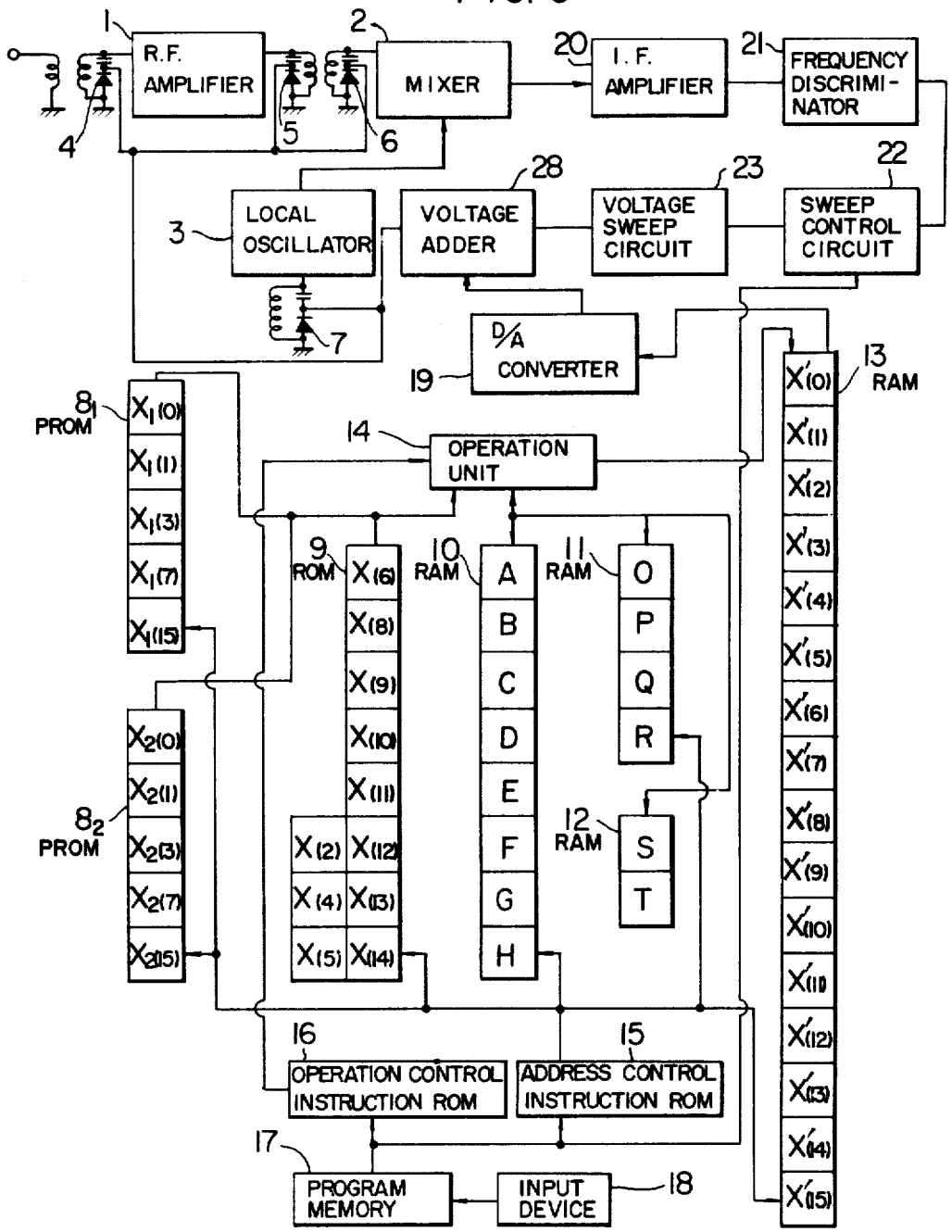

FIG. 6 shows a fifth embodiment of the present invention. Components 1 to 19 are the same as those of FIG. 5 and the associated operation of the components is also the same. Here, it is assumed that the tuning voltages in the Table II are voltages corresponding to boundary frequencies of the respective channels. The term "channel boundary frequency" is not limited to a boundary frequency in a narrow sense of the word which is defined by the assignment of the broadcasting frequencies but it is intended to include a boundary frequency which is defined by frequencies of incoming signals. In the present embodiment, the voltages corresponding to the boundary frequencies for the channel which is intended to be received are Hadamard transformed and stored in the same way as described heretofore, and during the channel selection operation they are inverse transformed and D/A converted to reproduce the voltages corresponding to the boundary frequencies from the D/A converter 19 through the inverse tranform. An output voltage from a voltage sweep circuit 23 is added to the reproduced voltages in a voltage adder 28 to effect search tuning of the broadcasting wave by a search tuning circuit comprising the R.F. amplifier circuit 1, mixer 2, local oscillator 3, intermediate frequency amplifier 20, frequency discriminator 21, sweep control circuit 22 and voltage sweep circuit 23. The sweep control circuit 22 is controlled by the program memory such that it produces a control output to start the sweep operation of the voltage sweep circuit 23 after the voltages corresponding to the boundary frequencies have been produced by the D/A converter 19.

FIG. 7 shows a sixth embodiment of the present invention, in which the components 1 to 18 are the same as those in FIG. 6 and the associated operation of the components is also the same. Here, it is assumed that the tuning voltages shown in the Table III are the voltages corresponding to the boundary frequencies of the respective channels. The present embodiment is one for identifying a receiving channel number of the search tuning apparatus, and the embodiment comprises the R.F. amplifier 1, mixer 2, local oscillator 3, intermediate frequency amplifier 20, frequency discriminator 21, sweep control circuit 22 and voltage sweep circuit 23. When the search tuning apparatus is tuned to an incoming electric wave to cause the variable capacitance diode 7 of the local oscillator 3 to produce a steadystate voltage, this voltage is A/D converted by an analog-to-digital converter (A/D converter) 24 and the converted voltage is applied to a comparator 25. On the other hand, the voltages corresponding to the channel boundary frequencies stored in the RAM 13 are sequentially transferred to the RAM 26 by the address control instruction from the output of the ROM 15, in such a manner that the two voltages x'(i) and x'(i+1) corresponding to adjacent boundary frequencies are transferred together. Here, by the output of input device 18 a program in the program memory 17 is selected and ROM 15 is controlled by the output of program memory 17 to output address control instructions as in previous embodiments. The comparator 25 determines whether the output from the A/D converter 24 falls between the voltages x'(i) and x'(i+1). The result of the comparison is entered in to the program memory 17 which is then outputted to control the ROM 15. By the control instruction from the output of the ROM 15 in response to the output of the program memory 17 the information transfer from the RAM 13 to the RAM 26 is controlled, and when the output of the A/D converter 24 falls between the voltages x'(i) and x'(i+1) the transfer is stopped. The output of the program memory 17 also controls ROM 16 which stores operation control instructions, and the operation control instruction outputted from the ROM 16 in response to the output of the program memory 17 controls a counter in the operation unit 14. The counter is reset to 0 upon the start of the transfer from the RAM 13 to the RAM 26, and it stops to count when it is detected that the output of the A/D converter 24 falls between the voltages x'(i) and x'(i+1). The contents of the counter is i, and this is shown on a channel number indicator 27 as a channel number. While the components 1 to 18 in FIG. 7 are shown to be identical to those of FIG. 6, it should be understood that they may be replaced by the components 1 to 18 shown in FIGS. 2 to 4.

Any one of a number of devices can be used as the channel number indicator, such as the television receiver screen, numeric display tubes and light emitting diodes (LEDs), etc. Those devices provide digital indication of the channel numbers. However, when it is desired to provide analog indication of the frequency of receiving signal like in a radio receiver, one may assign a frequency instead of a channel number described above, and constitute the same construction excluding the channel number indicator 27 and make the same operation. In this case, it is assumed that the following means are taken, that is, the contents of the counter in the operation unit 14 may be D/A converted and the converted output applied to a voltmeter to swing a needle thereof, or the binary contents of the counter may be decoded to fire an array of light emitting diodes. By using any of these means, it is possible to make the variation in the relation between the applied voltage and the receiving frequency by the variable capacitance diode not affect the indication of the receiving frequency.

As described hereinabove, according to the present invention, firstly, by digitizing and storing the tuning voltages of all channels or channel boundary voltages of the channel selection apparatus which uses the variable capacitance diode as a tuning element, no additional adjustment for the tuning and the channel indication is required at the time of the installation of the receiver set, thus reducing the adjustment costs, etc.

However, if the measured data themselves are stored for a large number of channels, it takes long time to store data and the material cost of the PROM etc. becomes expensive. In the present invention, noting the correlation which exists among the voltages to be applied corresponding to the respective channels within an electronic tuner and the correlation which exists among the voltages to be applied corresponding to the respective channels among different electronic tuners, the memory capacity is reduced by applying Hadamard transformation to the digitized voltages to be applied. Thus, the use of relatively expensive memories such as PROMs which require long times for the stored operation is reduced while relatively inexpensive memories such as ROM and RAM, which are easily mass produced, are used to thereby achieve an overall cost reduction. Secondly, as shown in the embodiment of FIG. 2, the transformed values obtained by the Hadamard transformation are stored at the respective addresses of the PROM in accordance with the channel number and the number of bits at each address of PROM are compressed, therefore, the memory capacity as a whole can be reduced in comparison with the situation where the data is stored in the PROM without transformation. Thirdly, as shown in the embodiment of FIG. 3, since the average values (representative values) of each sequence are stored in the ROM and the differences between the average values and the transformed values for each of the electronic tuner are stored in the PROM, the memory capacity can be further reduced in comparison with the embodiment of FIG. 2. Fourth, as shown in the embodiment shown in FIG. 4, only the relatively large values of the Hadamard transformed information are stored in the PROM and the rest are stored in the ROM, therefore, the memory capacity can be further reduced in comparison with the embodiments of FIGS. 2 and 3, and yet the error of the applied voltages reproduced through the inverse transform is within a range permissible for practical use. Fifth, as it is shown in the embodiment of FIG. 5, as for those of the Hadamard transformed values which have large values, average values (representative values) are stored in the ROM, and only the differences between the transformed values and the average values are stored in PROM for each of the electronic tuners, therefore, the memory capacity can be further reduced in comparison with the embodiment of FIG. 4. Sixth, in the case of embodiment of FIG. 6, the above-described Hadamard transformation is applied to the voltages corresponding to the channel boundary frequencies, therefore, when the channel to channel interval is 6 MHz as in the Japanese television broadcasting system, it is possible to make the permissible error of the reproduced voltage derived from the inverse transformation one corresponding to ±2 MHz, even if the drift of the local oscillation frequency of the electronic tuner of ±1 MHz is allowed. Therefore, this embodiment is more advantageous than the embodiments of FIGS. 2 to 5 when permissible error is taken into account.

In the embodiment of FIG. 7, by applying the frequencies of the signal to be received instead of the channel numbers, a problem of error between the actual receiving frequency and the indication of frequency due to variation of the relation between the voltage which is applied and the frequency of the receiving signal of the respective electronic tuners can be solved. Further, in the case of the sixth embodiment, the identification of the channel numbers in the search tuning apparatus, which has heretofore been difficult to obtain can be easily acquired.

What is claimed is:

1. A channel selection apparatus for a receiving device comprising:
    storage means including at least one programmable read only memory (PROM) for digitally storing information sequences obtained by Hadamard transforming digitized voltages corresponding to either frequencies of respective channels, or respective boundary frequencies between adjacent channels which may be received by said receiving device;
    processing means coupled to said storage means for inversely Hadamard transforming the transformed information sequences digitally stored in said storage means to synthesize said digitized voltages corresponding to channel frequencies or channel boundary frequencies;
    a read/write memory coupled to said processing means for storing the inversely Hadamard transformed digitized voltages obtained form said information sequences; and
    means for reading from said read/write memory selected digitized channel selection voltages and using said read voltages to either select a channel for said receiver or indicate the frequency of a selected channel.

2. A channel selection apparatus according to claim 1 wherein said digitized voltages represent respective boundary frequencies between adjacent channels, said apparatus further comprising a tuner having a local oscillator whose oscillation frequency sweeps upon the application of a sweep voltage derived from a sweep voltage control circuit, and a search tuning means for stopping the sweep of the sweep voltage by said sweep voltage control circuit when said tuner receives a desired incoming wave to cause said local oscillator to oscillate at a fixed frequency, said output of said read/write memory establishing boundary frequencies among the channels and being digital to analog converted and combined with said sweep voltage, a desired channel being selected by the operation of said sweep voltage control circuit with reference to a selected pair of boundary frequency analog signals.

3. A channel selection apparatus according to claim 1 wherein said digitized voltages represent respective boundary frequencies between adjacent channels, said apparatus further comprising a tuner having a local oscillator whose oscillation frequency sweeps upon the application of a sweep voltage derived from a sweep voltage control circuit, a search tuning means for stopping the sweep of the sweep voltage by said sweep voltage control circuit when said tuner receives a desired incoming signal to cause said local oscillator to oscillate at a fixed frequency, a receiving frequency indication means, and a comparator for comparing the voltage value digitally stored in two outputs of said read/write memory representing a selected pair of boundary frequencies with said sweep voltage, wherein said receiving frequency indication means provides an indication of a receiving frequency when said sweep voltage falls between said two outputs of said read/write memory.

4. A channel selection apparatus according to claim 1, wherein said Hadamard transformed information sequences are stored in ROMs in the form of representative values thereof for said channel frequencies or boundary frequencies, the difference between said stored representative values and the actual transformed values being stored in said at least one PROM, said stored information in said ROMS and PROMS being inverse-Hadamard transformed by said processing means.

5. A channel selection apparatus according to claim 1, wherein only those portions of the Hadamard transformed information sequences which have a relatively large value are stored in said at least one PROM and the remainder of said information sequences are stored in a ROM, said stored information in said PROM and ROM being inverse-Hadamard transformed by said processing means.

6. A channel selection apparatus according to claim 1, wherein representative values for each of said informational sequences are stored in a ROM and as to the larger values of said informational sequences the differences between the actual value of the transformed informational sequences and said representative values are stored in said at least one PROM, said stored information in said ROM and at least one PROM being inverse-Hadamard transformed by said processing means.

7. A channel selection apparatus according to claim 1, wherein said receiving device includes a variable capacitance diode as a tuning element and said digitized voltages represent frequencies of respective channels capable of being received by said receiving device, and wherein the output of said read/write memory is digital-to-analog converted, the analog voltage obtained by the digital-to-analog conversion being applied to said variable capacitance diode to establish a channel selection state.

* * * * *